United States Patent
Hong et al.

(10) Patent No.: US 7,357,873 B2
(45) Date of Patent: Apr. 15, 2008

(54) POLYMIDE THIN FILM SELF-ASSEMBLY PROCESS

(75) Inventors: Alex Hong, Kaohsiung (TW); I Yu Huang, Kaohsiung (TW); Chih Hung Wang, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 0 days.

(21) Appl. No.: 11/248,340

(22) Filed: Oct. 13, 2005

(65) Prior Publication Data
US 2007/0039919 A1   Feb. 22, 2007

(30) Foreign Application Priority Data
Aug. 17, 2005  (TW)  ............... 94128001 A

(51) Int. Cl.
C23F 1/00    (2006.01)
(52) U.S. Cl. .............. 216/2; 216/37; 216/57; 216/83; 438/698
(58) Field of Classification Search ........ 438/698; 216/2, 83, 57, 37
See application file for complete search history.

(56) References Cited

U.S. PATENT DOCUMENTS 5,645,684 A * 7/1997 Keller .............. 148/33.2
6,299,462 B1 * 10/2001 Biegelsen ............ 439/81

OTHER PUBLICATIONS

Ebefors et al. (J. Micromech. Microebg. 8 (1998) (pp. 188-194)).*
Suzuki et al. ((journal of Microelectromechanical systems. vol. 3, No. 1, (1994) (pp. 4-9).*

* cited by examiner

*Primary Examiner*—Nadine Norton
*Assistant Examiner*—Mahmoud Dahimene
(74) *Attorney, Agent, or Firm*—Bacon & Thomas, PLLC

(57) ABSTRACT

The invention presents a novel polyimide-based thin film self-assembly technology, including five process steps described as follows: (1) deposits a sacrificial layer and a low-stress microstructure layer on a silicon substrate; (2) patterns and etches the low-stress microstructure layer to provide a stationary part and a movable part of the microstructure; (3) coats a photosensitive polyimide thin film as elastic joint of the microstructure layer and defines the shape by using photolithography technique; (4) releases the sacrificial layer beneath the movable part of microstructure layer by wet etching; (5) lastly proceeds the reflow process of polyimide to result in the contraction of the elastic joint further to rotate and lift the movable part in completion of the self-assembly of the microstructure. As the invention can be extensively applied to a myriad of miniaturizing industries, it can solve all the drawbacks of the prior art manufacturing process and miniaturization.

12 Claims, 2 Drawing Sheets

POLYMIDE THIN FILM SELF-ASSEMBLY PROCESS

FIELD OF THE INVENTION

The invention presents a polyimide thin film self-assembly process, which utilizes an integrated miniaturized planar technology with simple, fast and economical characteristics so as to solve the shortcomings of the conventional self-assembly technology.

BACKGROUND OF THE INVENTION

The development and application of the miniaturization technology is the major trend of modern science, and the self-assembly technology, in particular, is the rudimentary method of the microscopic world in the recent years.

Speaking of the micro rotary fan manufactured by Microelectromechanical systems (MEMS) technology, as shown in Appendix 1, the portion between the Scratch Drive Actuator (SDA) of the micro rotary fan and the micro blades structure must be implemented by virtue of the self-assembly technology and multi-user MEMS processes (MUMPs).

The so-called self-assembly technology means that the microstructure will self-align after the completion of the final release process. As shown in Appendix 2, the conventional self-assembly technology has the following three types.

Type 1 uses the residual stress from the manufacturing process to generate the deformation resulting in the displacement of microstructure as shown in FIG. 1 of Appendix 2, which illustrates a 3D micro-optic switch developed by Lucent Technology.

Type 2 uses surface acoustic wave generated by ultrasonic wave to move the microstructure to a preset position by vibration as shown in FIG. 2 of Appendix 2.

Type 3 uses the solder ball, photoresist or other polymer to form an elastic joint on the micro-hinge. A molten state of the elastic joint will be present under high temperature reflow process so as to generate a surface tension force pulling up the microstructure as shown in FIG. 3 of Appendix 2.

However, type 1 and type 2 of the traditional self-assembly technology are only applicable to the static application or the fixed microstructure, but not suitable for dynamic or rotated microstructure such as the micro-fan application.

In regard to type 3 self-assembly technology, there are a host of materials suitable for elastic joint fabrication. Different materials featured respective advantages. Take the solder ball as an example:

Lead contamination: The solder ball is composed of tin and lead (63Sn/37Pb). During the reflow process, facilities and environment will be contaminated by lead.

High cost: Most of the surface micromachined microstructures are usually constructed by polycrystalline silicon (Poly-Si), where a layer of gold pad must be coated as an interconnection between the solder ball and Poly-Si. This additional process will inevitably result in production difficulty and cost increasing.

Poor precision: To calculate the raised angle or displacement of microstructure, the dimension of solder ball must be accurately controlled. However, traditional solder ball usually has a volume deviation up to 25%, which makes the precision of the raised angle or displacement uncontrollable.

Manual processing: So far, attaching the solder ball on the gold pad still adopts the manual alignment processing.

Miniaturizing infeasibility: Currently, the smallest diameter of solder ball is no less than 100 μm, which limits the minimum size of the solder-based devices.

Taking the elastic joint formed by photoresist as another example:

The manufacturing process of the elastic joint formed by photoresist is not as complicated as that of the solder ball, and the cost thereof is also lower. However, the release of the microstructure must be processed by dry or wet etching.

The dry etching utilizes liquid carbon dioxide to release the microstructure and replace the water molecule so as to avoid the stick effect of the microstructure. Whereas, the super critical $CO_2$ dry release equipment used for the method is quite expensive, and thus the cost of this process is relatively high.

The wet etching requires no additional manufacturing equipment, making it a solution with less cost. However, after etching the sacrificial layer with the solution of diluted hydrofluoric acid (HF) or buffered oxide etch (BOE), further apply the isopropyl alcohol (IPA) to quickly vaporize the water molecules. The IPA is characterized by dissolving the photoresist so that it will damage the photoresist-based elastic joint fabricated originally.

In sum, considering production cost, process integration and miniaturization capability, a brand new manufacturing process is urgently required to resolve various shortcomings arising from the elastic joint formed by the solder ball or the photoresist.

SUMMARY OF THE INVENTION

In view of this, the invention provides a polyimide-based thin film self-assembly technology, including five process steps described as follows: (1) deposits a sacrificial layer and a low-stress microstructure layer on a silicon substrate; (2) patterns and etches the low-stress microstructure layer to provide a stationary part and a movable part of the microstructure; (3) coats a photosensitive polyimide thin film as elastic joint of the microstructure layer and defines its shape by using photolithography technique; (4) releases the sacrificial layer beneath the movable part of microstructure layer by wet etching; (5) lastly proceeds the reflow process of polyimide to result in the contraction of the elastic joint further to rotate and lift the movable part in completion of the self-assembly of the microstructure. As the invention can be extensively applied to a myriad of miniaturizing industries, it can solve all the drawbacks of the prior art and satisfy the requirements of low cost, simple manufacturing process and miniaturization.

DETAILED DESCRIPTION OF THE PREFERRED EMBODIMENT

The invention relates to a polyimide thin film self-assembly process, which utilizes a photosensitive polyimide thin film as material for the elastic joint. During the reflow process, a molten state of the polyimide-based elastic joint is demonstrated under high temperature (380° C.~405° C.) and the surface tension force is generated to pull up the microstructure.

Figure 1:
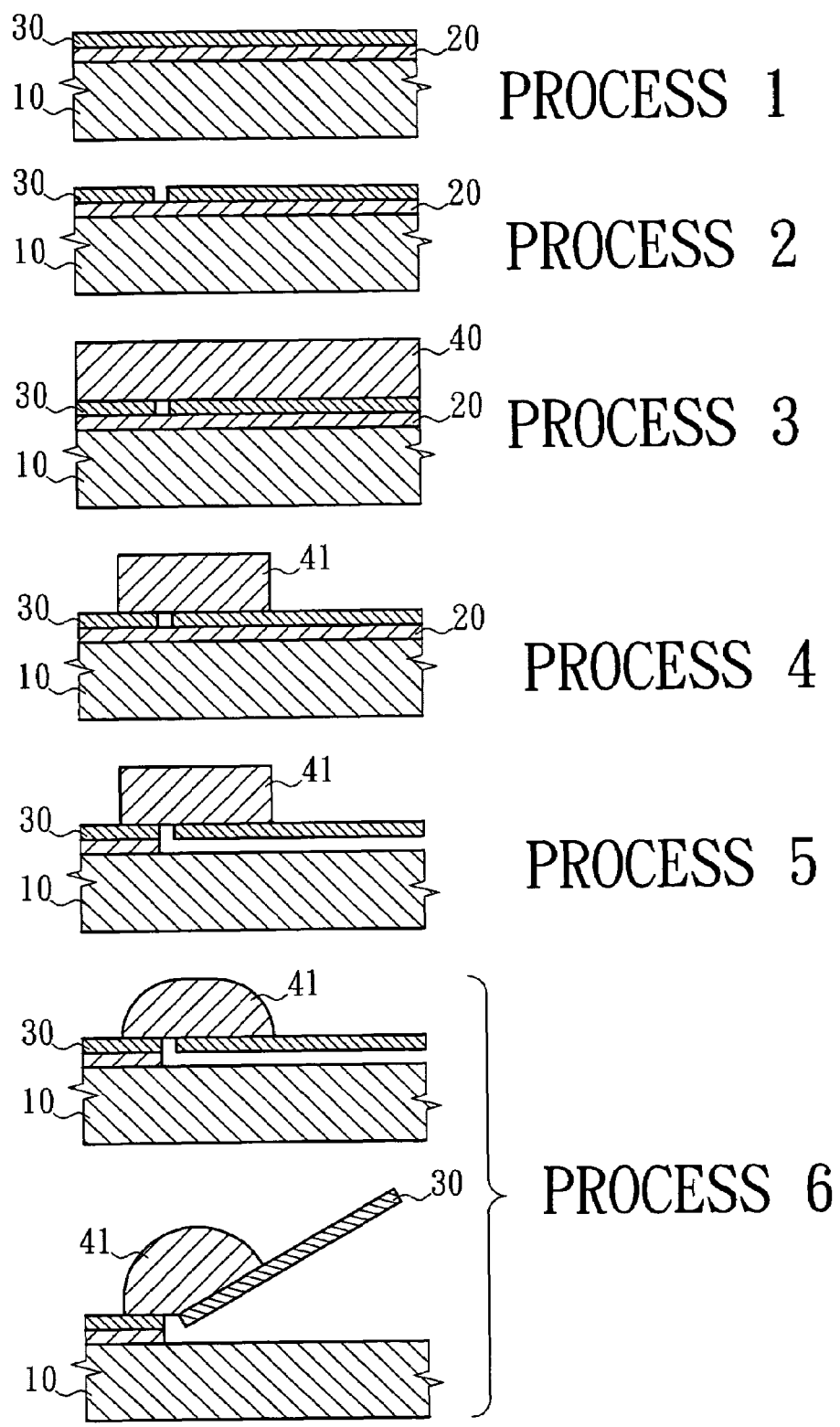
FIG. 1 is a schematic diagram showing the manufacturing processes of the present invention.

As shown in FIG. 1, the manufacturing processes of the present invention include:

process 1: depositing an phosphosilicate glass (PSG) on the silicon substrate 10 as the sacrificial layer 20 by means of the Plasma Enhanced Chemical Vapor Deposition (PECVD) system and further depositing the low-stress Poly-Si on the sacrificial layer 20 as the microstructure layer 30 by means of the Low Pressure Chemical Vapor Deposition (LPCVD) system;

process 2: carrying out the first photolithography process and etching the microstructure layer 30 to define the entire contour by using an Inductively Coupled Plasma (ICP) etching system;

process 3: using the spin coater to deposit a photosensitive polyimide thin film 40 on the microstructure layer 30;

process 4: carrying out the second photolithography process to define the shape of the polyimide elastic joint 41;

process 5: immersing the wafer in the BOE to carry out the wet etching of the pre-defined portion of the sacrificial layer 20 then release the microstructure layer; and process 6: carrying out the reflow process of polyimide thin film by using high temperature oven, results in a molten state of the elastic joint 41 under 380° C.~405° C. high temperature. The heated polyimide elastic joint 41 generates a contracted deformation to rotate and lift the pre-defined portion of the Poly-Si microstructure layer 30 as shown in Appendix 3.

First of all, compare the pros and cons of the polyimide elastic joint formed by the present invention and the solder ball respectively.

The present invention has no lead pollution.

The present invention requires no additional gold pad coated for the connection interface so as to address a simple and inexpensive manufacturing process.

The invention can conduct the alignment with rather high precision by virtue of the photolithography technique so as to provide a better precision.

The invention can perform an integrated miniaturized planar self-assembly processing.

The miniaturized size of the present invention has no limitation.

Furthermore, compare the pros and cons of the polyimide elastic joint formed by the present invention and photoresist.

Although photosensitive polyimide and photoresist are categorized as polymer materials, polyimide has a greater surface tension force which raised a larger angle of the same microstructure layer. Consequently, the present invention is free of the concern that the elastic joint is damaged by being dissolved in IPA.

As the photosensitive polyimide thin film is better in withstanding the organic solution, it can be developed to an inexpensive wet etching process. Therefore, the fabrication cost of the invention is relatively low.

In summary, the invention can simplify the manufacturing process, lower the cost and completely solve the shortcomings arising from the elastic joint formed by the solder ball or photoresist.

Figure 2:
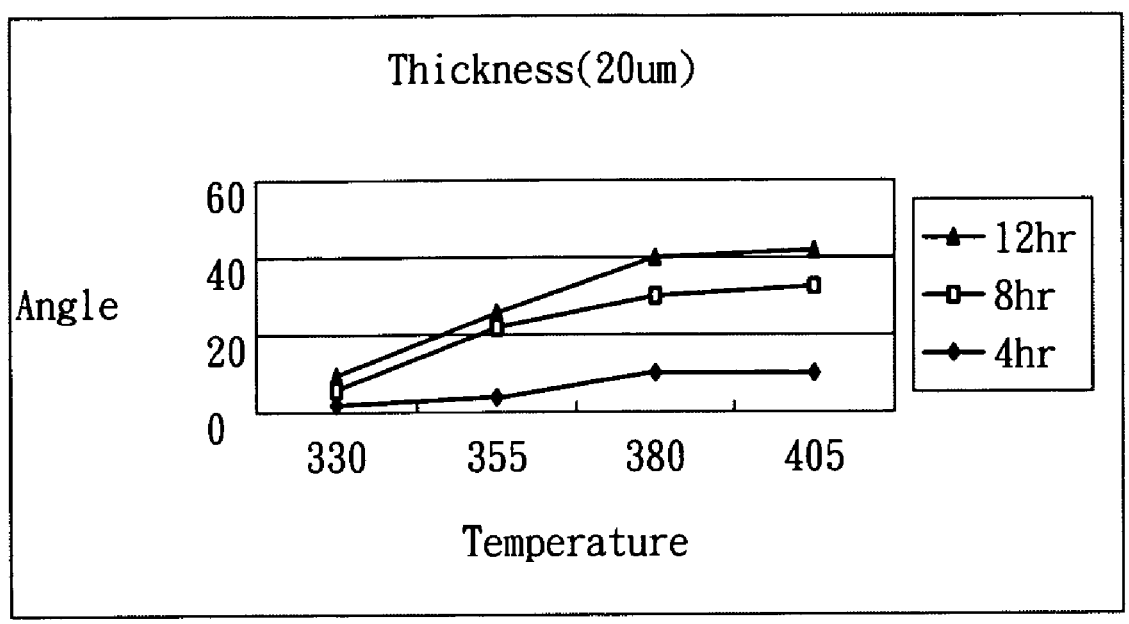
FIG. 2 is a diagram showing the relationship between the reflow temperature of polyimide and raised angle of the microstructure layer of the present invention.

Moreover, as shown in FIG. 2, time and temperature will directly affect the raised angle of the pre-defined raised portion of the Poly-Si microstructure layer 30. As a result, by controlling the time and reflow temperature of the polyimide, the raised angle of the pre-defined raised portion of the microstructure layer 30 can be accurately controlled.

The actual results based on the experiment of the photosensitive polyimide thin film with a thickness 20 μm are shown as follows.

The patterned microstructure layer 30 cannot be lifted up when the temperature of the reflow process is below 330° C.;

The raised phenomenon will gradually appear when the reflow temperature of polyimide reaches 380° C. and more;

In according with the experimental results, the raised angle at 405° C. reflow temperature is larger than at 380° C., but the yield at 405° C. only half of that at 380° C. or even less. This is due to the fact that the photosensitive polyimide thin film will excessively contract at 405° C. (or higher) causes the width of polyimide smaller than the gap between the movable part and the stationary part of Poly-Si microstructure layer 30, making the malfunction of polyimide ° C. elastic joint 41.

In our experience, the optimized reflow temperature of the polyimide-based elastic joint is 380° C.

By means of the above fabrication processes, the present invention totally resolves the myriad of shortcomings arising from the solder ball or photoresist elastic joint and can be extensively applied to the self-assembly technology in various miniaturizing industry. Accordingly, the present invention is not only a novelty and a progress but also has an industry utility.

The polyimide thin film self-assembly process of the invention may be applied to the development of a scratch-drive actuator (SDA) based micro rotary fan, applied to the self-assembly of a micro-optical bench chip or is applied to the self-assembly of a micro-optical switch. The polyimide thin film self-assembly process of the invention may also be applied to the self-assembly of a micro-passive device, the micro-passive device may be a micro-inductor or a micro-capacitor.

What is claimed is:

1. A polyimide thin film self-assembly process, comprising:
   a. obtaining a support substrate;
   b. depositing a PECVD phosphosilicate glass (PSG) sacrificial layer on top of said support substrate;
   c. depositing a low-stress undoped LPCVD polysilicon microstructure layer on top of said PECVD PSG sacrificial layer;
   d. coating a high surface tension force polyimide thin film on top of said low stress LPCVD polysilicon microstructure layer;
   e. patterning and etching an elastic joint form on said high surface tension force polyimide thin film;
   f. carrying out a wet etching process to etch and release a pre-defined portion of the said PECVD PSG sacrificial layer; and
   g. carrying out a reflow process to result in contracted deformation of said high surface tension force polyimide elastic joint to rotate and lift a pre-defined portion of said low stress LPCVD polysilicon microstructure layer.

2. The polyimide thin film self-assembly process of claim 1 is applied to the development of a scratch-drive actuator (SDA) based micro rotary fan.

3. The polyimide thin film self-assembly process of claim 1 is applied to a self-assembly of a micro-optical bench chip.

4. The polyimide thin film self-assembly process of claim 1 is applied to a self-assembly of a micro-optical switch.

5. The polyimide thin film self-assembly process of claim 1 is applied to a self-assembly of a micro-passive device.

6. The polyimide thin film self-assembly process of claim 5, wherein the said micro-passive device is a micro-inductor.

7. The polyimide thin film self-assembly process of claim 5, wherein the said micro-passive device is a micro-capacitor.

8. The polyimide thin film self-assembly process of claim 1, wherein said as-coated high surface tension force polyimide thin film is 20 μm thick.

9. The polyimide thin film self-assembly process of claim 1, wherein the reflow process of said high surface tension force polyimide thin film is done in a nitrogen filled oven and cured at 380~405 degrees Celsius.

10. The polyimide thin film self-assembly process of claim 8, wherein the reflow process of said high surface tension force polyimide thin film is done in a nitrogen filled oven and cured at 380~405 degrees Celsius.

11. The polyimide thin film self-assembly process of claim 9, wherein the reflow process of said high surface tension force polyimide thin film is done in a nitrogen filled oven and cured at 380 degrees Celsius.

12. The polyimide thin film self-assembly process of claim 10, wherein the reflow process of said high surface tension force polyimide thin film is done in a nitrogen filled oven and cured at 380 degrees Celsius.

* * * * *